United States Patent
Hosoe

(10) Patent No.: US 10,658,052 B2
(45) Date of Patent: May 19, 2020

(54) SEMICONDUCTOR DEVICE

(71) Applicant: Winbond Electronics Corp., Taichung (TW)

(72) Inventor: Yuki Hosoe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/388,890

(22) Filed: Apr. 19, 2019

(65) Prior Publication Data

US 2019/0348135 A1     Nov. 14, 2019

(30) Foreign Application Priority Data

May 14, 2018   (JP) .................................. 2018-092783

(51) Int. Cl.
  *G11C 16/30*   (2006.01)
  *G05F 1/56*    (2006.01)
  *G11C 16/04*   (2006.01)

(52) U.S. Cl.
  CPC ............. *G11C 16/30* (2013.01); *G05F 1/56* (2013.01); *G11C 16/0483* (2013.01)

(58) Field of Classification Search
  CPC ......................... G11C 16/30; G11C 16/0483
  USPC ......................... 327/540, 205; 323/282–284
  See application file for complete search history.

(56) References Cited

U.S. PATENT DOCUMENTS

| 4,887,022 A | * | 12/1989 | Gontowski | ............. G05F 1/571 323/284 |
| 5,266,884 A | * | 11/1993 | Agiman | .................. G05F 1/571 323/284 |
| 8,742,739 B2 | | 6/2014 | Nien et al. | |
| 2005/0206422 A1 | * | 9/2005 | Mehas | ................ H02M 3/1588 327/205 |
| 2015/0162745 A1 | * | 6/2015 | Ikeda | ..................... H02H 9/046 361/56 |

FOREIGN PATENT DOCUMENTS

| CN | 201229513 | 4/2009 |
| JP | 2008160399 | 7/2008 |
| TW | 201424229 | 6/2014 |

* cited by examiner

*Primary Examiner* — Tomi Skibinski
(74) *Attorney, Agent, or Firm* — JCIPRNET

(57) ABSTRACT

Provided is a semiconductor device capable of adjusting an internal voltage after the internal voltage is raised. An internal voltage raising circuit of a flash memory includes: an internal voltage generation circuit for generating an internal voltage based on a power supply voltage supplied from outside; a determination circuit for comparing the internal voltage with a reference voltage and generating an enablement signal when detecting that the internal voltage is greater than the reference voltage; and an internal circuit operable in response to the enablement signal. In response to the generation of the enablement signal, the determination circuit lowers the reference voltage to increase a difference between the reference voltage and the internal voltage, and prevents the enablement signal from being disabled during subsequent trimming of the internal voltage.

9 Claims, 6 Drawing Sheets

SEMICONDUCTOR DEVICE

CROSS-REFERENCE TO RELATED APPLICATION

This application claims the priority benefit of Japan application serial no. 2018-092783, filed on May 14, 2018. The entirety of the above-mentioned patent application is hereby incorporated by reference herein and made a part of this specification.

BACKGROUND

Technical Field

The disclosure relates to a semiconductor device (e.g., a flash memory), and more particularly to generation of an internal voltage at the time when power is turned on or the like.

Description of Related Art

An NAND type flash memory utilizes a fuse cell to store setting information, such as voltages for reading/programming/erasing, user options and the like. In general, the fuse cell is set in a storage area, which is not accessible to users, within a memory cell array. When power is turned on, as a power-on sequence, the flash memory loads the setting information stored in the fuse cell into a configuration register or the like and controls operations based on the loaded setting information.

When power is turned on, the operation voltage may tend to be unstable, and the internal circuit or the like may malfunction. In order to avoid such problems, Patent Document 1 (Japanese Laid-Open No. 2008-160399) discloses a power-on system reset circuit. When power is turned on, the power-on system reset circuit stops the sequence that has been started, resets the system until the power supply stabilizes, and starts the system once the power supply stabilizes.

SUMMARY

FIG. 1 is a block diagram illustrating an internal configuration of an internal voltage raising circuit of a conventional flash memory. The internal voltage raising circuit 10 includes an internal voltage generation circuit 20 for generating an internal voltage VI according to an external power supply Vcc, and a determination circuit 30 for comparing the internal voltage VI output from the internal voltage generation circuit 20 with a reference voltage Vref. The determination circuit 30 outputs an enablement signal EN at high (H) level, for example, when detecting that the internal voltage VI is equal to or greater than the reference voltage Vref. The enablement signal EN is a signal applied to ensure operation of an internal circuit (e.g., a latch circuit, a clock circuit, etc.) of the flash memory, and the internal circuit becomes an operable state in response to the enablement signal EN. In other words, it is used to guarantee the operation.

The internal voltage raising circuit 10 is operated when the power supply voltage Vcc is applied or when the internal voltage is required. That is, when the power supply voltage Vcc is input or when a selection signal SEL from a controller is asserted in a state where the power supply voltage Vcc is input, the internal voltage generation circuit 20 is operated.

FIG. 2 shows the waveform of each part of the internal voltage raising circuit 10 when the power supply voltage Vcc is applied. When the power supply voltage Vcc is applied at the time t1, the internal voltage generation circuit 20 starts to generate the internal voltage VI to be a target voltage. When detecting that the internal voltage V1 reaches the reference voltage Vref at the time t2, the determination circuit 30 outputs the enablement signal EN. For example, the target voltage of the internal voltage VI is 1.2V, and the reference voltage Vref is 0.9V.

Due to manufacturing variations of the semiconductor device, the internal voltage VI generated by the internal voltage generation circuit 20 may not reach the target voltage. In the above example, although a margin of 0.3V is between the internal voltage VI and the reference voltage Vref when the internal voltage VI reaches the target voltage. However, when the manufacturing variation increases, the margin between the internal voltage VI and the reference voltage Vref may decrease, and the operation of the internal voltage raising circuit 10 becomes unstable.

As such, before products are shipped, the internal voltage VI of the internal voltage generation circuit 20 may be trimmed during testing at a wafer level, a chip level or a package level. In addition, trimming data for making the internal voltage VI consistent with or close to the target voltage is determined, and the determined trimming data is stored in the fuse cell. For this reason, the internal voltage generation circuit 20 is provided with a function of trimming the internal voltage VI based on an externally provided trimming signal TR.

FIG. 3 shows the waveform of each part at the time when the internal voltage VI is trimmed. The trimming of the internal voltage VI is started at the time tx after the power supply voltage Vcc is applied and the enablement signal EN is output by the determination circuit 30. For instance, as shown in FIG. 3, the internal voltage generation circuit 20 changes the internal voltage VI to VIa, VIb and VIc according to the trimming signal TR, but when the internal voltage VI is lowered to VIa and VIb, the internal voltage VI may be lower than the reference voltage Vref, and the enablement signal EN may be switched to a disable state. As such, the internal circuit is reset, the power-on sequence is resumed, and thus the test including the trimming of the internal voltage cannot be performed. On the other hand, if the internal voltage VI is adjusted not to fall below the voltage VIc of the reference voltage Vref, the trimming is limited to a very narrow range.

In view of the above, the disclosure provides a semiconductor device capable of adjusting an internal voltage after raising of the internal voltage.

A semiconductor device according to the disclosure includes an internal voltage generation part generating an internal voltage based on a power supply voltage supplied from outside; a determination part comparing the internal voltage with a reference voltage, and generating an enablement signal when detecting that the internal voltage is greater than the reference voltage; an internal circuit operable in response to the enablement signal; and a drop part lowering the reference voltage in response to generation of the enablement signal.

According to the disclosure, since the reference voltage is lowered in response to generation of the enablement signal, the difference between the internal voltage and the reference voltage can be increased after generation of the enablement signal. Thus, when the internal voltage is adjusted after generation of the enablement signal, the internal voltage can be prevented from falling below the reference voltage, and a problem of failing to adjust the internal voltage due to resume of the internal circuit and restart of the power-on sequence can be avoided. Further, by increasing the margin between the internal voltage and the reference voltage, an appropriate range for trimming the internal voltage can be ensured.

DESCRIPTION OF THE EMBODIMENTS

Next, embodiments of the disclosure will be described in detail with reference to the drawings. In the case where a semiconductor device of the disclosure has a function of generating an internal voltage according to a power supply voltage Vcc supplied from the outside, other functions thereof are not particularly limited. In the following description, an NAND type flash memory is exemplified as the semiconductor device.

EMBODIMENTS

Figure 1:
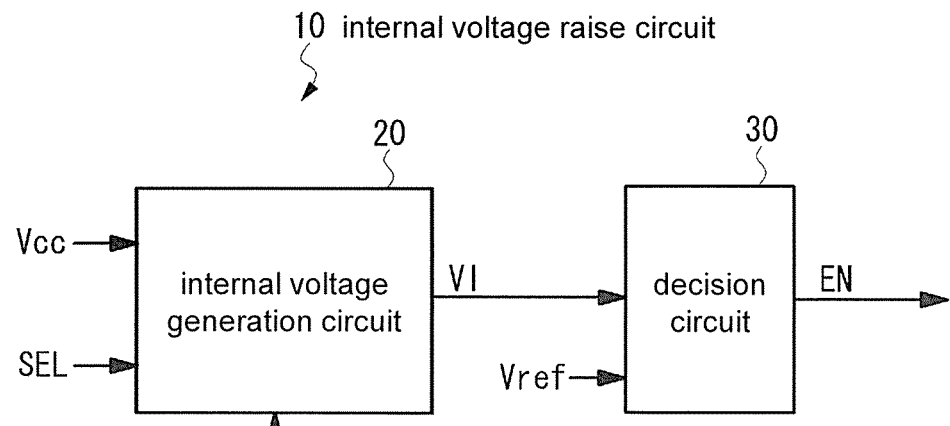
FIG. 1 is a block diagram showing a configuration of a conventional internal voltage raising circuit.
Figure 2:
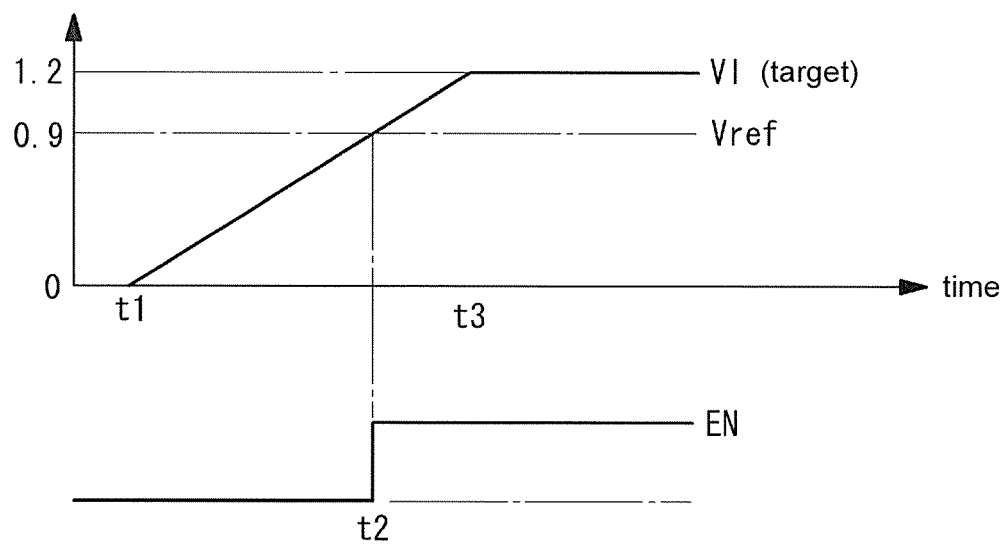
FIG. 2 is a diagram illustrating the operation of the conventional internal voltage raising circuit.
Figure 3:
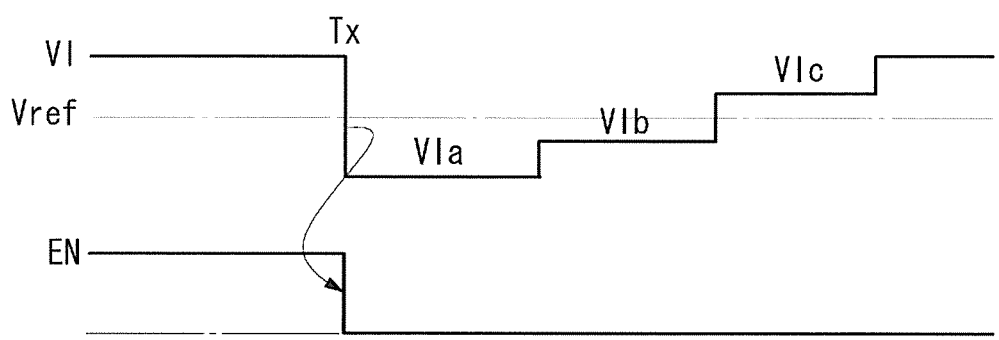
FIG. 3 is a diagram illustrating a problem of the conventional internal voltage raising circuit.
Figure 4:
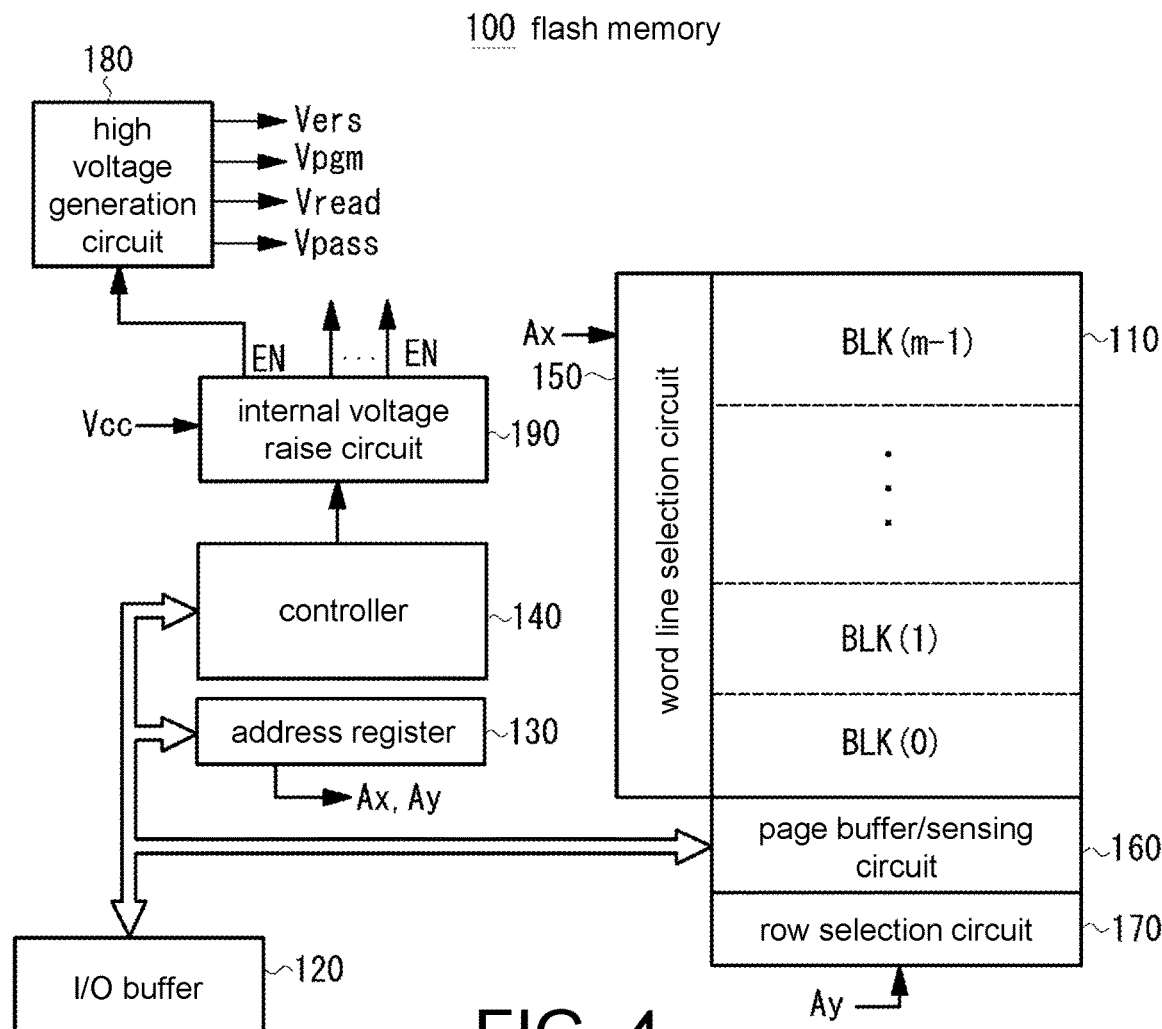
FIG. 4 is a block diagram showing a configuration of a flash memory according to an embodiment of the disclosure.

FIG. 4 shows a configuration of the flash memory according to an embodiment of the disclosure. The flash memory 100 of the present embodiment includes a memory array 110 having a plurality of memory cells arranged in an array; an input/output (I/O) buffer 120 connected to external input/output terminals I/O; an address register 130 for receiving address data from the I/O buffer 120; a controller 140 for receiving command data and the like from the I/O buffer 120 and controlling each part; a word line selection circuit 150 for decoding row address information Ax from the address register 130 and selecting a block and a word line according to the decoding result; a page buffer/sensing circuit 160 for holding the data read from a page selected by the word line selection circuit 150 and holding the input data to be programmed to the selected page; a column selection circuit 170 for decoding column address information Ay from the address register 130 and selecting column address data in the page buffer/sensing circuit 160 according to the decoding result; a voltage generation circuit 180 for generating various voltages (e.g., writing voltage Vpgm, pass voltage Vpass, reading pass voltage Vread, erasing voltage Vers, etc.) required for reading/programming/erasing data; and an internal voltage raising circuit 190 for generating an internal voltage based on a power supply voltage Vcc supplied from the outside.

The memory array 110 has m memory blocks BLK(0), BLK(1) . . . BLK(m−1) in a column direction. A plurality of NAND string units in which a plurality of memory cells are connected in series are formed in one memory block. In addition, the memory array 110 includes a fuse cell for storing setting information related to an operation voltage, etc. of the flash memory. In general, the fuse cell is an area not accessible to users.

During a reading operation, a positive voltage is applied to a bit line, 0V for example is applied to a selected word line, a pass voltage is applied to an unselected word line, a selection transistor at a bit line side and a selection transistor at a source line side are turned on, and 0V is applied to a common source line. During a programming operation, a high programming voltage Vpgm is applied to the selected word line, a medium electrical potential is applied to the unselected word line, the selection transistor at the bit line side is turned on, the selection transistor at the source line side is turned off, and an electrical potential corresponding to data "0" or "1" is supplied to the bit line GBL. During an erasing operation, 0V is applied to the selected word line in the block, a high voltage is applied to a P-well, and electrons of the floating gate are pulled out to the substrate to erase the data in the unit of block.

Figure 5:
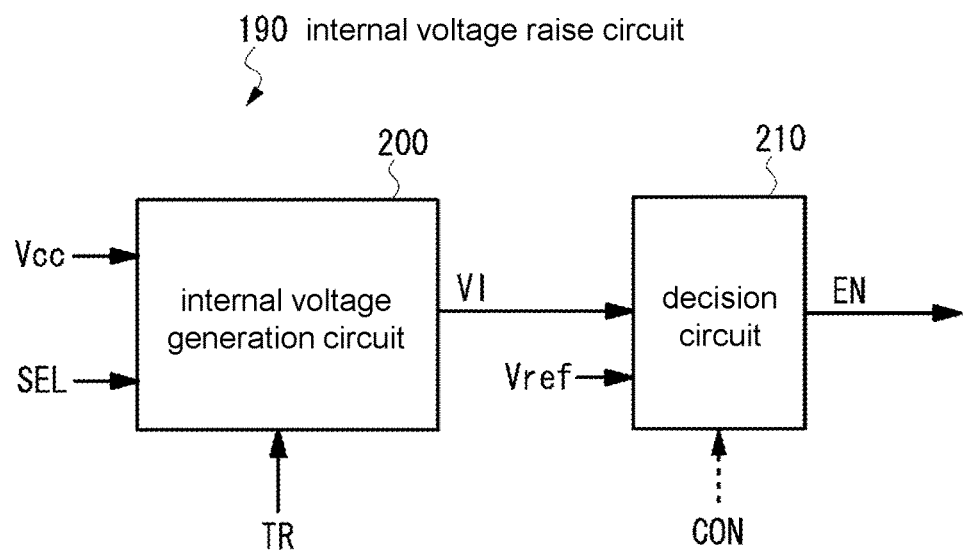
FIG. 5 is a diagram showing an internal configuration of an internal voltage raising circuit according to the present embodiment.

FIG. 5 is a block diagram showing an internal configuration of the internal voltage raising circuit 190 according to the present embodiment. As shown in FIG. 5, the internal voltage raising circuit 190 includes an internal voltage generation circuit 200 and a determination circuit 210. When the power supply voltage Vcc is supplied from the outside or when receiving an instruction from the controller 140 (e.g., the controller 140 outputs a selection signal SEL for operating a part of a plurality of internal voltage generation circuits), the internal voltage generation circuit 200 generates an internal voltage VI.

Figure 6:
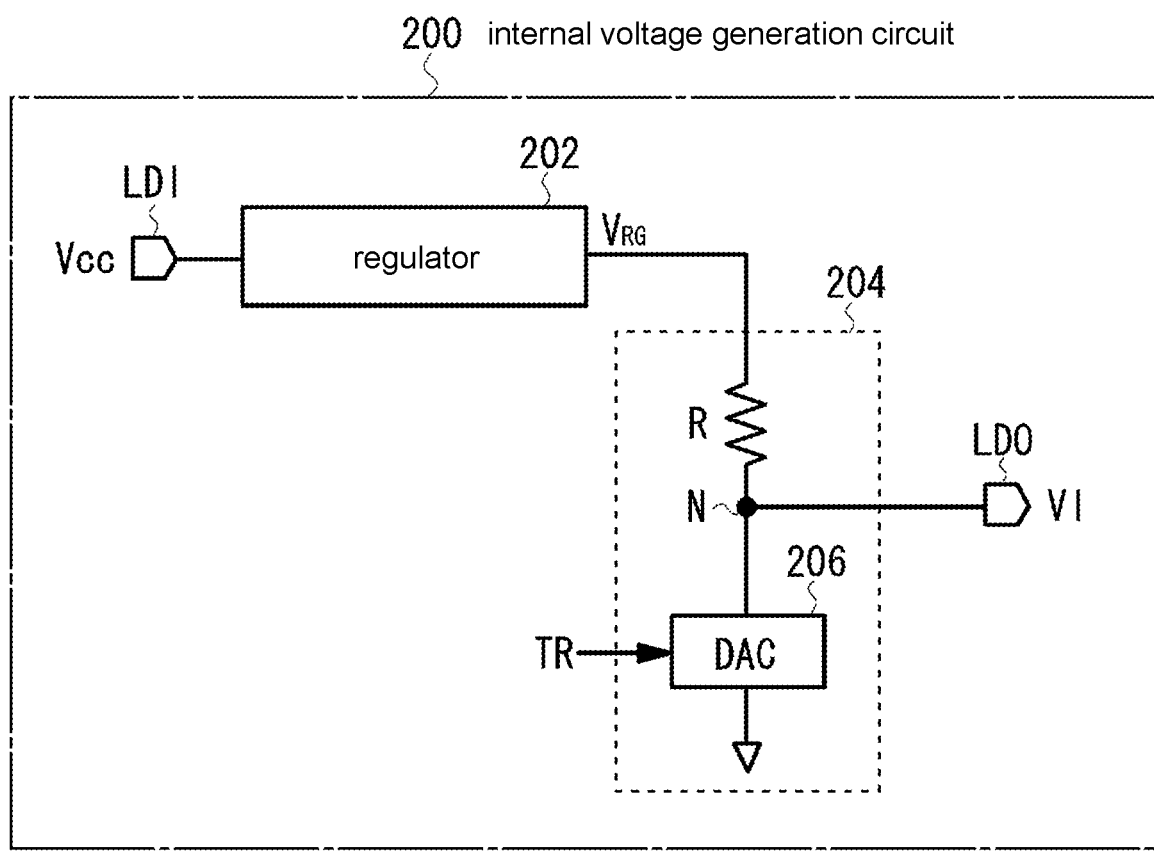
FIG. 6 is a diagram showing an internal configuration of an internal voltage generation circuit according to the present embodiment.

FIG. 6 shows a configuration example of the internal voltage generation circuit 200. The internal voltage generation circuit 200 includes an input node LDI for receiving the power supply voltage Vcc supplied from the outside; a regulator 202 for generating a voltage $V_{RG}$ based on the power supply voltage Vcc input to the input node LDI; an adjustment circuit 204 connected to the output of the regulator 202 for adjustment of the internal voltage; and an output node LDO connected to a node N of the adjustment circuit 204.

The adjustment circuit 204 includes a resistor R and a DAC 207 connected to the resistor R via the node N. A resistance of the DAC 207 is varied based on a trimming signal TR, and a voltage division ratio of the internal voltage VI generated in the node N is adjusted. In an embodiment, the trimming signal TR includes an n-bit trimming code, and the DAC 207 includes a plurality of switching elements (transistors) corresponding to the n-bit trimming code and a plurality of resistors connected to the switching elements, and sets the voltage division ratio at the node N in the adjustment circuit 204 variable according to the trimming code.

For instance, the power supply voltage Vcc supplied from the outside is 1.8V. The internal voltage generation circuit 200 is designed such that when the DAC 207 is in an initial state or when the trimming signal TR is not input, an internal voltage VI of, for instance, 1.2V is output from the output node LDO as the target voltage. However, the internal voltage VI may be deviated from the target voltage (1.2V) due to variations in the semiconductor manufacturing process or influence of the working temperature. Since the target voltage is a voltage for ensuring operations of peripheral circuits of the flash memory, the internal voltage VI is expected to be consistent with or close to the target voltage.

In an embodiment, the internal voltage VI may be trimmed during a test before products are shipped. For example, the trimming signal TR for changing the internal voltage VI is supplied to the internal voltage generation circuit 200 from a testing terminal or an electrode pad at a wafer level, a chip level or a package level. The trimming signal TR may be supplied to the internal voltage generation circuit 200 from an external testing apparatus, or when the flash memory 100 is equipped with a built-in self-testing circuit, the trimming signal TR may be supplied by the self-testing circuit.

During trimming of the internal voltage VI, an n-bit trimming code of the trimming signal TR is supplied to the DAC 207, and the DAC 207 generates a resistance corresponding to the trimming code. The trimming code of the trimming signal TR is changed from the minimum digital value to the maximum digital value, and the internal voltage VI varies corresponding thereto. Checking of the internal voltage VI may be performed, for instance, by monitoring the voltage output from the output node LDO, and an optimum trimming code for bringing the internal voltage VI close to the target voltage is identified. The identified optimum trimming code is programmed to the fuse cell in the memory cell array 110. Nevertheless, the above configuration of the internal voltage generation circuit 200 is merely an example, and the disclosure is not limited thereto.

Figure 7:
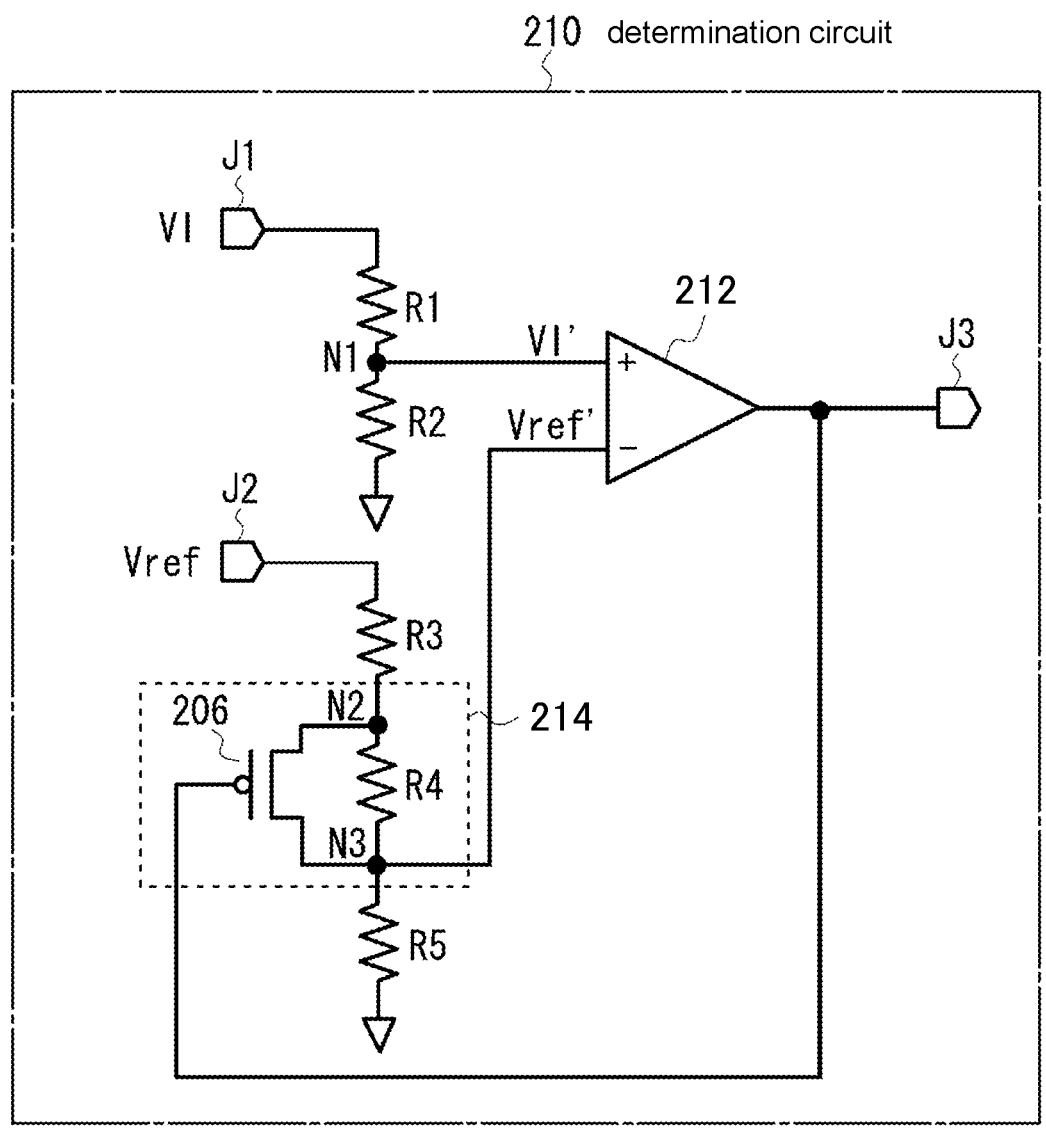
FIG. 7 is an example showing a circuit of an internal configuration of a determination circuit according to the present embodiment.

When detecting that the internal voltage VI generated by the internal voltage generation circuit 200 is equal to or greater than the reference voltage Vref, the determination circuit 210 outputs an enablement signal EN. FIG. 7 shows an internal configuration of the determination circuit 210. The determination circuit 210 includes a node J1 for inputting the internal voltage VI output from the output node LDO of the internal voltage generation circuit 200; a node J2 for inputting the reference voltage Vref; a comparator 212; a node J3 for outputting a comparison result of the comparator 212; and a drop circuit 214 for lowering the reference voltage Vref based on the comparison result of the comparator 212. The reference voltage Vref is supplied from, for example, another reference voltage generation circuit.

Resistors R1 and R2 are connected in series between the node J1 and GND, and a divided internal voltage VI' (by resistors) generated at a connection node N1 between the resistor R1 and the resistor R2 is input to a non-inverting input terminal (+) of the comparator 212. A resistor R3, the drop circuit 214 and a resistor R5 are connected in series between the node J2 and GND, and a divided reference voltage Vref' generated at a connection node N3 between the drop circuit 214 and the resistor R5 is input to an inverting input terminal (−) of the comparator 212.

The drop circuit 214 includes a resistor R4 connected in series with the resistor R3 and the resistor R5, and includes a PMOS transistor 206 connected in parallel to the resistor R4. The gate of the transistor 206 is connected to the output of the comparator 212, and the S/D electrodes of the transistor 206 are connected to the connection nodes N2 and N3, respectively.

Figure 8:
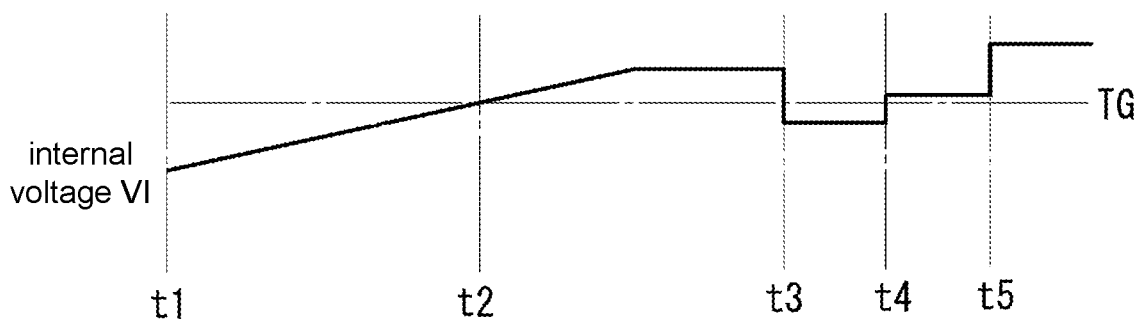
FIG. 8 is a diagram illustrating trimming of the internal voltage according to the present embodiment.

Next, an operation of the internal voltage raising circuit 190 of the present embodiment will be described. FIG. 8 illustrates an operation waveform of the internal voltage VI at the time when the power supply voltage Vcc is applied. The power supply voltage Vcc is applied at the time t1, and the internal voltage VI reaches the target level TG at the time t2. Thereafter, the internal voltage VI is trimmed at the time t3.

For instance, during trimming of the internal voltage VI, the trimming code is changed, such that the internal voltage VI changes stepwise at fixed time intervals. In the example of FIG. 8, a trimming code for minimizing the internal voltage VI is provided at the time t3, a trimming code for increasing the internal voltage VI by a step voltage is provided at the time t4, and a trimming code for increasing the internal voltage VI by a step voltage is provided at the time t5. By changing the trimming code sequentially in this manner, the internal voltage VI is changed. In FIG. 8, the internal voltage VI is changed in three stages, but it is merely an example. The internal voltage VI may be lowered gradually, or the internal voltage VI may be changed in four or more stages.

Figure 9:
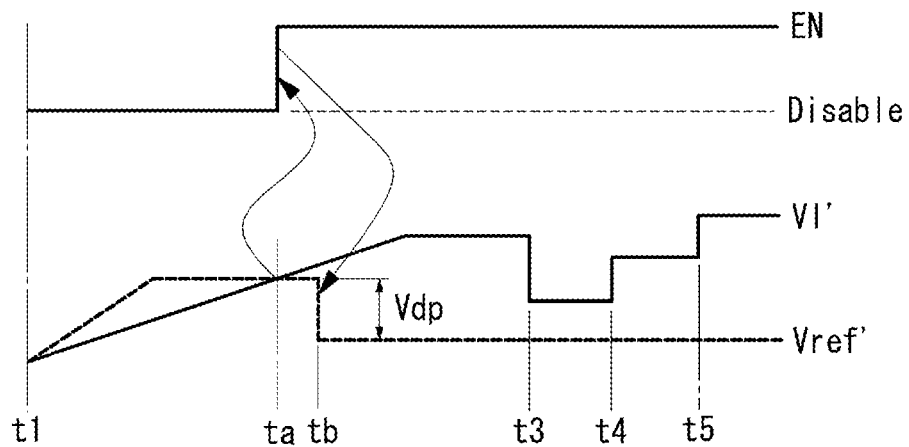
FIG. 9 is a waveform diagram of each part of the determination circuit during trimming of the internal voltage according to the present embodiment.

FIG. 9 is a waveform diagram illustrating an operation of the determination circuit during trimming. At the time t1, the power supply voltage Vcc is applied, and the internal voltage VI' and the reference voltage Vref' begin to rise. At this time, since the enablement signal EN is at a low (L) level, the transistor 206 is in an ON state. Therefore, the resistor R4 is in fact shorted, and the reference voltage Vref' is a voltage level indicating a divided voltage of the resistors R3 and R5, i.e., the voltage at the node N2.

When the internal voltage VI' becomes equal to or greater than the reference voltage Vref' at the time ta, the enablement signal EN at the high (H) level is output by the comparator 212. The enablement signal EN is supplied to the peripheral circuits of the flash memory via the node J3, and at the same time fed back to the gate of the transistor 206. At the time tb, the transistor 206 is set to an OFF state in response to the enablement signal EN at the high (H) level, and the reference voltage Vref' drops to the divided voltage level at the node N3, that is, drops by a voltage Vdp. The voltage drop amount Vdp is determined by the resistance of the resistor R4, and the dropped reference voltage Vref' is set to be higher than GND (0V).

Thereafter, trimming of the internal voltage VI is performed at the time t3. As the reference voltage Vref' is lowered, the margin between the reference voltage Vref' and the internal voltage VI' is increased. Accordingly, the trimming range in which the internal voltage VI can be changed by the trimming signal TR can be made larger than before. In addition, during trimming of the internal voltage VI, the enablement signal EN switches to a disable state, whereby it is possible to prevent the situation that trimming and testing are interrupted and the power-on sequence is resumed during testing. Furthermore, since the reference voltage Vref' is at a level higher than GND, if the internal voltage drops due to an abnormality of the peripheral circuits, the power-on sequence can be properly performed in response thereto.

In the above embodiment, the voltage drop amount Vdp of the reference voltage Vref' is determined by the resistor R3, but this is merely an example, and the reference voltage Vref' may be lowered by other methods or circuits. In addition, even though the drop amount Vdp of the reference voltage Vref' can be set to any value, when the range in which the internal voltage VI can be changed by the trimming signal TR is ±Vt (Vmin to Vmax), for example, the drop amount Vdp of the reference voltage Vref' can be set as Vdp≥Vt. As a result, when the internal voltage VI drops due to the trimming signal, it can be ensured that the enablement signal EN would not be inverted to the disable state.

In the above embodiment, the output of the comparator 212 is fed back to the transistor 206 to lower the reference voltage Vref', but this is merely an example, and the reference voltage Vref' may be lowered by other methods. For example, the controller 140 may output a control signal CON to set the transistor 206 of the drop circuit 214 to the OFF state in response to the enablement signal EN output from the determination circuit 210.

Figure 10:
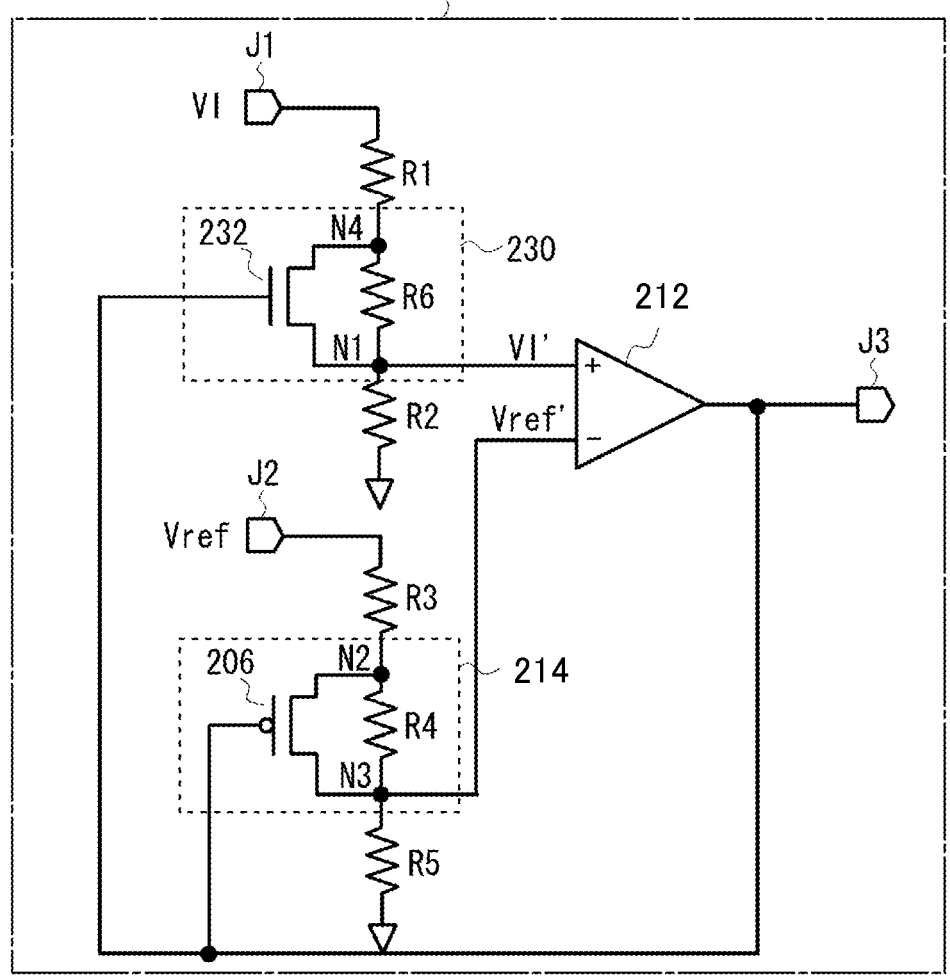
FIG. 10 is a diagram showing an internal configuration of a determination circuit according to another embodiment of the disclosure.

Next, another embodiment of the disclosure will be described. In the above embodiment, the reference voltage Vref' is lowered in response to the generation of the enablement signal EN. However, in another embodiment, the internal voltage VI' may be raised somewhat in response to the generation of the enablement signal EN. FIG. 10 shows an internal configuration of a determination circuit 210A of another embodiment. As shown in FIG. 10, a raising circuit 230 for raising the internal voltage VI' is connected between the resistor R1 and the resistor R2. The raising circuit 230 includes a resistor R6 connected in series with the resistor R1, and includes an NMOS transistor 232 connected in parallel to the resistor R6. The gate of the NMOS transistor 232 is connected to the output of the comparator 212, and the S/D electrodes are connected to the nodes N4 and N1, respectively.

Figure 11:
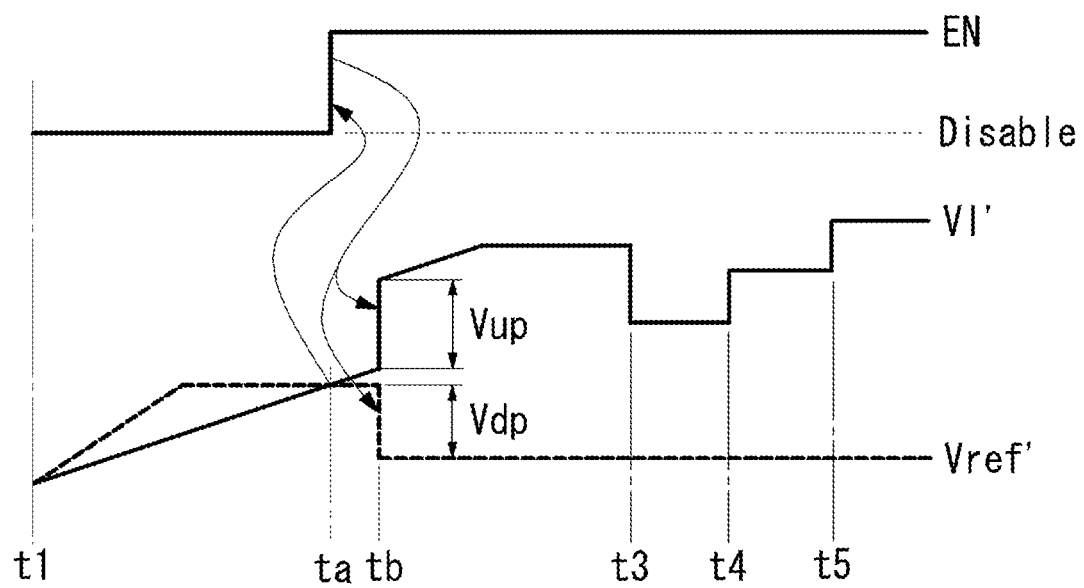
FIG. 11 is a waveform diagram of each part of the determination circuit during trimming of the internal voltage according another embodiment.

FIG. 11 is a diagram showing the operation waveform of each part of the determination circuit 210A at the time when the internal voltage is trimmed. At the time t1, the power supply voltage Vcc is applied, and the internal voltage VI' and the reference voltage Vref' begin to rise. At this time, since the enablement signal EN is at the low (L) level, the transistor 232 is in an OFF state. Therefore, the internal voltage VI' is at a divided voltage level at the node N1. On the other hand, the transistor 206 is in the ON state as described above.

When the internal voltage VI' becomes equal to or greater than the reference voltage Vref' at the time ta, the output of the comparator 212 is switched from the disable state at the low (L) level to the enable state at the high (H) level in response thereto. At the time tb, in response to the enablement signal EN at the high (H) level, the transistor 232 is set to the ON state, thereby the resistor R6 is in fact shorted, and the internal voltage VI' is raised to the divided voltage at the node N4. A voltage rise amount Vup can be determined by the resistor R6.

Thereafter, trimming of the internal voltage VI is performed at the time t3. Since the internal voltage VI' of the determination circuit 210A is raised by the voltage rise amount Vup after the enablement signal EN is generated, the difference between the internal voltage VI' and the reference voltage Vref' can be further increased. Accordingly, the range for trimming the internal voltage VI can be further increased, and at the same time the switch of the enablement signal EN to the disable state due to the trimming of the internal voltage VI can be prevented.

Another embodiment as described above illustrates an example that the internal voltage VI' is raised and the reference voltage Vref' is decreased at the same time in response to the generation of the enablement signal EN. However, the internal voltage VI' may be raised while the reference voltage Vref' remains constant.

In the above embodiments, the internal voltage raising circuit in the flash memory is presented as an example, but the disclosure can also be applied to semiconductor devices such as other semiconductor memories, semiconductor logic circuits and the like.

Although exemplary embodiments of the disclosure have been described in detail above, the disclosure is not limited to the specific embodiments, and various modifications and changes are possible within the scope of the disclosure described in the claims.

What is claimed is:

1. A semiconductor device, comprising:
   an internal voltage generation part generating an internal voltage based on a power supply voltage supplied from outside and receiving a trimming signal for trimming the internal voltage, wherein a range of the internal voltage be able to be changed by the trimming signal is ±Vt;
   a determination part comparing the internal voltage with a reference voltage, and generating an enablement signal when detecting that the internal voltage is greater than the reference voltage;
   an internal circuit operable in response to the enablement signal;
   wherein the determination part comprises:
   a drop part lowering the reference voltage in response to generation of the enablement signal;
   a first resistor;
   a second resistor,
   a comparator for comparing the internal voltage with the reference voltage, and wherein the drop part lowers the reference voltage with a drop amount in response to an output of the comparator, and the drop amount is larger than or equal to Vt,
   wherein the drop part, the first resistor and the second resistor are connected in series between the reference voltage and ground, a first terminal of the first resistor is connected to the reference voltage, a first terminal of the second resistor is connected to ground, the drop part is connected between the first resistor and the second resistor,
   wherein the drop part comprises a first transistor and a third resistor, the first transistor is connected in parallel to the third resistor, a first terminal of the third resistor is connected to a second terminal of the first resistor, a second terminal of the third resistor is connected to a second terminal of the second resistor, the first transistor is switched in response to the enablement signal,
   wherein the second terminal of the third resistor is connected to an inverting input terminal of the comparator to input the reference voltage lowered by the drop part.

2. The semiconductor device according to claim 1, wherein the internal voltage generation part comprises a circuit for changing the internal voltage based on an adjustment signal that is input, and the adjustment signal is input after generation of the enablement signal.

3. The semiconductor device according to claim 2, wherein a range in which the internal voltage is lowered by the adjustment signal is smaller than a drop amount of the reference voltage.

4. The semiconductor device according to claim 2, wherein the adjustment signal is input to the internal voltage generation part during testing at a wafer level, a chip level or a package level.

5. The semiconductor device according to claim 1, wherein the reference voltage that is lowered is greater than 0V.

6. The semiconductor device according to claim 1, further comprising a raising part for raising the internal voltage in response to generation of the enablement signal.

7. The semiconductor device according to claim 6, wherein the raising part raises the internal voltage in response to an output of the comparator.

8. The semiconductor device according to claim 7, wherein the raising part comprises a second transistor which is switched in response to the enablement signal, and sets a resistance of a circuit for generating the internal voltage variable by the second transistor.

9. The semiconductor device according to claim 1, further comprising a memory part for storing an adjustment result obtained when the internal voltage generation part is adjusted.

* * * * *